(12) United States Patent
Hanna

(10) Patent No.: US 8,983,646 B1
(45) Date of Patent: Mar. 17, 2015

(54) INTERACTIVE DIGITAL DRAWING AND PHYSICAL REALIZATION

(71) Applicant: Barbara Hanna, Berkeley, CA (US)

(72) Inventor: Barbara Hanna, Berkeley, CA (US)

( * ) Notice: Subject to any disclaimer, the term of this patent is extended or adjusted under 35 U.S.C. 154(b) by 0 days.

(21) Appl. No.: 14/511,049

(22) Filed: Oct. 9, 2014

Related U.S. Application Data

(60) Provisional application No. 61/889,459, filed on Oct. 10, 2013.

(51) Int. Cl.
*G06F 19/00* (2011.01)
*B29C 67/00* (2006.01)
*G06F 17/50* (2006.01)

(52) U.S. Cl.
CPC ............ *B29C 67/0088* (2013.01); *G06F 17/50* (2013.01)
USPC ........................................... 700/119; 246/401

(58) Field of Classification Search
USPC ............ 700/98, 119, 120, 182, 193; 246/401, 246/308, 497; 433/24; 156/379.6
See application file for complete search history.

(56) References Cited

U.S. PATENT DOCUMENTS

| | | | |
|---|---|---|---|
| 4,575,330 A | 3/1986 | Hull | |
| 5,609,813 A * | 3/1997 | Allison et al. | 264/401 |
| 5,705,117 A * | 1/1998 | O'Connor et al. | 264/401 |
| 6,622,062 B1 | 9/2003 | Earl et al. | |
| 7,373,286 B2 | 5/2008 | Nikolskiy et al. | |
| 2008/0036771 A1 * | 2/2008 | Bae | 345/442 |
| 2011/0087350 A1 * | 4/2011 | Fogel et al. | 700/98 |
| 2011/0188780 A1 * | 8/2011 | Wang et al. | 382/293 |
| 2014/0257548 A1 | 9/2014 | Bachrach | |

OTHER PUBLICATIONS

Cao et al., 3D Object Retrieval Using 2D Line Drawing and Graph Based Relevance Feedback, The Chinese University of Hong Kong, Oct. 23, 2006; p. 105-108.*

* cited by examiner

*Primary Examiner* — Kidest Bahta
(74) *Attorney, Agent, or Firm* — Roy Rosser

(57) ABSTRACT

A system and method for interactively producing a 3D representation of a vector graphic is disclosed. A vector graphic representing a 2D graphic having a number of endpoints joined by vector segments is automatically or interactively converted into a triangulated mesh in a form readable by a 3D printer. The conversion from vector graphic to a triangulated mesh is accomplished by generating an n-sided polygon in the vicinity of each endpoint of the vector graphic. Each of the vertices of the polygon are then be joined by a line to a corresponding vertex on the next adjacent polygon. Each vertex is also joined to an adjacent vertex on the next adjacent polygon. The process is continued until all polygons are joined, resulting in a triangulated mesh, which is then converted into a format readable by a 3D printer and sent to a 3D printer to produce the 3D representation.

19 Claims, 3 Drawing Sheets

US 8,983,646 B1

INTERACTIVE DIGITAL DRAWING AND PHYSICAL REALIZATION

CLAIM OF PRIORITY

This application claims priority to U.S. Ser. No. 61/889,459 filed on Oct. 10, 2013 the contents of which are hereby fully incorporated by reference.

FIELD OF THE INVENTION

The invention relates to interactive 3D drawing and realization, and more particularly to a system and method for converting a 2D line drawing or vector graphic into a physically realized object using 3D printing.

BACKGROUND OF THE INVENTION 3D printing is a well-known technology used to produce 3D products using successive horizontal layers. Most 3D printers use computer files generated from a computer generated 3D CAD/CAM, animation or dedicated modeling software. Computer programs are typically used to convert these 3D engineering models into a succession of slices that may then be built up by printing one layer at a time.

A data interface between the modeling software and the 3D printing machines may, for instance, be the Stereo Lithography (STL) file format. An STL file stores the shape of a part using triangular facets. Other common formats are the Polygon File Format (PLY) and the Stanford Triangle Format, both of which may be used to store three dimensional data from 3D scanners.

To perform a print, a 3D printer typically reads the design from an STL file, converts it into a preparatory code such as, but not limited to, G-Code, and then uses those instructions to lay down successive layers of liquid, powder, paper or sheet material and so build 3D physical realization of the model as a series of cross-sections. These layers, each of which corresponds to a virtual cross-section calculated from the CAD model, are deposited, joined or automatically fused to create the final shape. The primary advantage of this technique is its ability to create almost any shape or geometric feature.

There are a variety of 3D printing methods including, but not limited to, selective laser sintering (SLS), fused deposition modeling (FDM), direct metal laser sintering (DMLS), selective laser melting (SLM), or stereo-lithography (SLA) or some combination thereof.

The materials that may be 3D printed include materials such as, but not limited to, thermoplastics, thermoplastic powder, resins, photopolymers, Titanium alloys, stainless steel, aluminum, or ceramics, or some combination thereof.

3D printing of an object may take anywhere from 30 minutes to several days, depending on the method used and the size and complexity of the model.

SUMMARY OF THE INVENTION

An inventive system and method for interactively producing a 3D realization of a vector graphic is disclosed.

In a preferred embodiment, a vector graphic that may represent a 2D graphic such as, but not limited to, a line drawing, may be loaded into a digital computing device. A vector graphic typically has number of endpoints joined by vector segments and may be represented mathematically as an approximation of an open ended curve having no width. The digital computing device may be running a software module that may automatically convert such a vector graphic into a triangulated mesh in a form that may be readable by a 3D printer.

The conversion from vector graphic to a mathematical model of a triangulated mesh may, for instance, be accomplished by the software first generating a mathematical model of an n-sided polygon in the vicinity of each endpoint of the vector graphic and at other locations sampled along the mathematical representation of the open ended curve. Each of the n vertices of the n-sided polygon may then be joined by a computer generated mathematical line to a corresponding vertex on the next adjacent polygon. Each vertex may also be joined to an adjacent vertex on the next adjacent polygon. The process may be continued until all polygons are joined in the same manner, resulting in a mathematical model of a triangulated mesh that may correspond in shape to the vector graphic.

This triangulated mesh may then be converted into a format that may be read by a 3D digital printer such as, but not limited to, STL or DFX format.

Once converted to a file readable by a 3D printer, the file may be sent to a 3D printer and a 3D object printed.

Therefore, the present invention succeeds in conferring the following, and others not mentioned, desirable and useful benefits and objectives.

It is an object of the present invention to provide a system and method to rapidly transform open ended curves and lines that may be generated by user movement or other means into tangible 3D objects representative of the open ended curves and lines.

It is a further object of the invention to produce a method of converting a line drawing into a triangulated mesh in a computationally efficient manner.

It is yet a further object of the invention to provide a triangulated mesh having a surface composed of Delaunay triangles.

Another objective of the invention is to provide a structure that may be realized by 3D printing in under 30 minutes.

DESCRIPTION OF THE PREFERRED EMBODIMENTS

Figure 1:
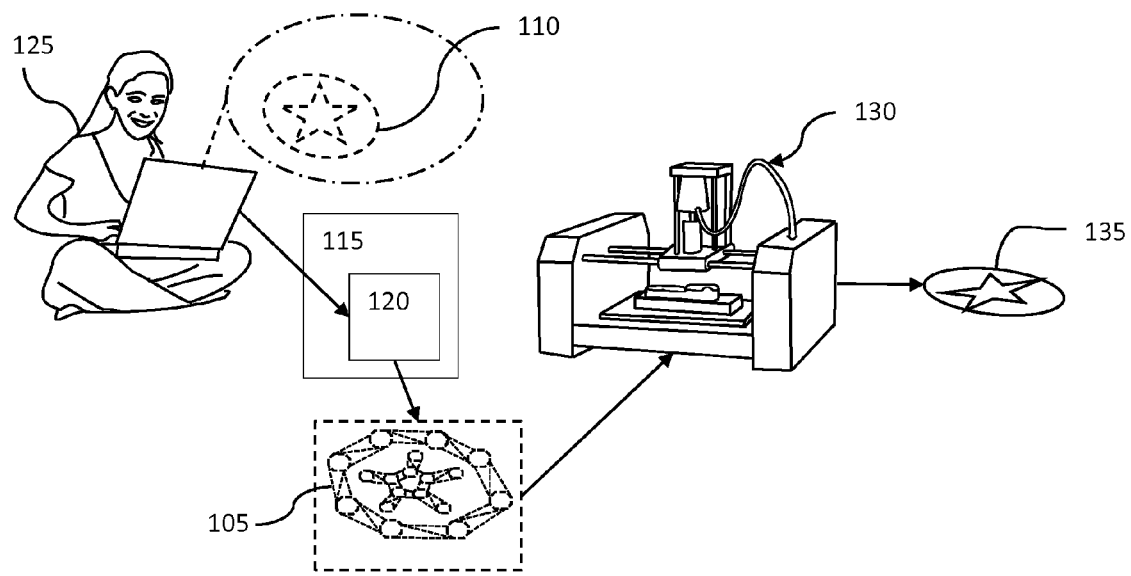
FIG. 1 shows schematic representation of a system of the present invention for interactively producing a 3D representation of a vector graphic.

The preferred embodiments of the present invention will now be described with reference to the drawings. Identical elements in the various figures are identified with the same reference numerals.

Reference will now be made in detail to embodiments of the present invention. Such embodiments are provided by way of explanation of the present invention, which is not intended to be limited thereto. In fact, those of ordinary skill in the art may appreciate upon reading the present specification and viewing the present drawings that various modifications and variations can be made thereto.

A neglected area of 3D printing is the 3D physical realization of digital drawing such as, but not limited to, 2D and 3D line drawings These physical realizations may be 3D structures or physical objects that give volumetric form to line drawings such as handwritten messages, signatures, caricatures or cartoons, or they may be close approximations to curves representative of a motion through time, varying from, for instance, a doodle created by a finger moving on a touch screen or through gesture, a ballet dancer's movement during a performance captured by stereo cameras to a journey in a car captured by a GPS system.

These line drawings essentially have no width when represented mathematically. The problem, therefore, is to convert what is essentially a one dimensional object into a 3D representation that may be printed by a 3D printer, preferably in a computationally efficient manner that results in a design that may be rapidly printed by a 3D printer.

FIG. 1 shows schematic representation of a system of the present invention interactively producing a 3D representation of a vector graphic.

In a preferred embodiment, a user 125 may supply a vector graphic 110 that may be representative of a 2D object such as, but not limited to, a line drawing. The vector graphic 110 may, for instance, be supplied via a personal or mobile computing device to a digital computing device 115. The vector graphic may, for instance, be altered, either automatically or with user inputs or with or a combination thereof. Such alteration may be performed, all or in part, using predefined algorithms or scripts, that result in the vector graphic being altered by actions such as, but not limited to, being complemented, being supplemented, being distorted by stretching or compression in one or more dimensions, or some combination thereof. The used may initiate or invoke the algorithms or scripts by means of and input that may be conveyed by an action such as, but not limited to, touch, gesture, voice, light, pressure, biosensing inputs such as, but not limited to, heart rate, blood pressure, skin conductivity or some combination thereof, and or by various physically collected inputs such as temperature, or vibration, or some combination thereof.

The digital computing device 115 may be running a software module 120 that may automatically transform the vector graphic 110 into a 3D printable triangular mesh 105. This 3D printable triangular mesh 105 may then be translated into a format readable by a 3D printer 130. The 3D printer 130 may then produce a 3D physical object, representing the vector graphic, in one of the materials the 3D printer 130 may be capable of printing.

The format readable by a 3D printer 130 may, for instance, be a language such as STL or DXF. These are well-known standards in the industry. STL, for instance, is a language developed specifically for stereo-lithography, an early form of 3D printing, that has become a defacto standard for the industry. STL represents surfaces as consisting of multiple joined triangles specified by the vertices of the triangle in 3D Cartesian coordinates, and the normal to the surface of the triangle, as three orthogonal vectors.

The 3D printer may operate using any of the well-known 3D print technologies such as, but not limited to, selective laser sintering (SLS), fused deposition modeling (FDM), direct metal laser sintering (DMLS), selective laser melting (SLM), or stereo-lithography (SLA) or some combination thereof. The materials used to create the 3D print may be any of the well-known materials used in 3D printing such as, but not limited to, thermoplastics, thermoplastic powder, photo-polymers, resins, Titanium alloys, stainless steel, aluminum, or ceramics, or some combination thereof.

Figure 2:
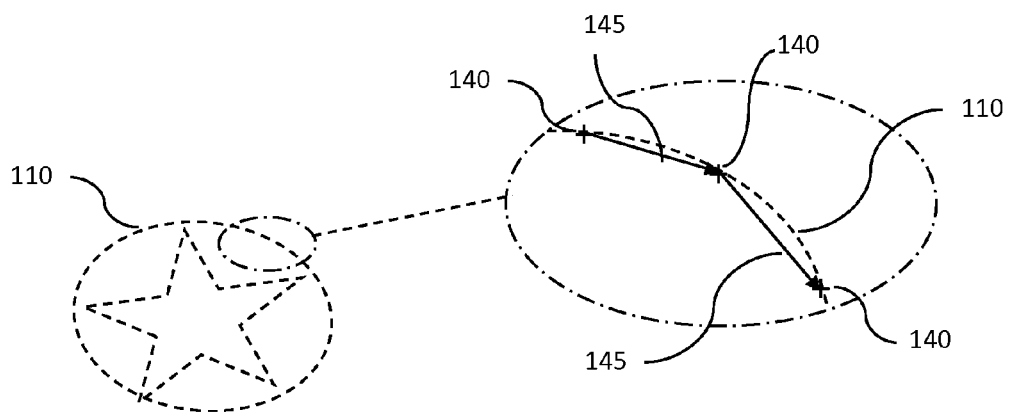
FIG. 2 shows a schematic representation of a vector graphic.

FIG. 2 shows a schematic representation of a vector graphic 110. A portion of a curve of the outer circle is shown magnified. In the magnified portion of the curve, FIG. 2 shows how the curve may be represented, or approximated, by a series of endpoints 140 with vector segments 145 joining the endpoints 140. The representation may have no width. The curve it approximates may be an open ended curve, i.e. a curve in which the starting point and the ending point are not the same point. One of ordinary skill in the art will appreciate that open ended curves may be joined together to form larger open ended curves, or broken apart to form a number of shorter open ended curves.

Figure 3:
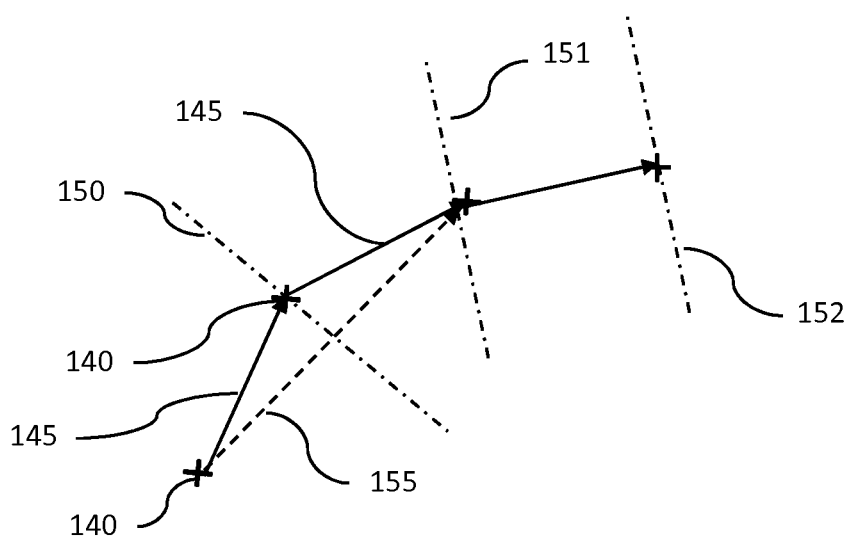
FIG. 3 shows a schematic representation of a step in converting a vector graphic into a 3D machine readable object.

FIG. 3 shows a schematic representation of a step in converting a vector graphic into a 3D machine readable object. In order to draw a polygon associated with an endpoint 140, a suitable orientation for the polygon may need to be determined. This orientation may, for instance, be defined as the plane that includes all the vertices of the polygon.

As shown in FIG. 3, a suitable orientation may be selected as a plane that is oriented substantially orthogonal 150 to the resultant vector 155 formed by adding the two vector segments 145 that join at the endpoint 140. The selected plane preferably also has the property of passing through the endpoint that it may be associated with.

In a preferred embodiment, a computationally simpler method may provide a satisfactory orientation plane. The orientation plane 151 may, for instance, be a plan that may be orthogonal to the vector 145 adjacent the current endpoint but following it. The orientation plane 152 may, for instance, be a plan that may be orthogonal to the vector 145 adjacent the current endpoint but preceding it.

Figure 4:
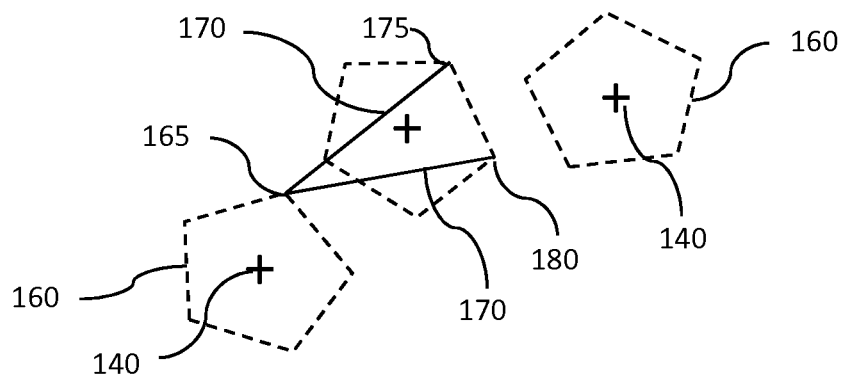
FIG. 4 shows a schematic representation of a further step in converting a vector graphic into a 3D machine readable object.

FIG. 4 shows a schematic representation of a further step in converting a vector graphic into a 3D machine readable object. Having selected a plane in which to orient the polygon, a mathematical representation of an n-sided polygon may be automatically generated. FIG. 4 shows a regular pentagon being generated at each end point.

In a preferred embodiment, the polygons are preferably congruent, regular polygons, i.e., they all have the same number of sides and all the sides of all the polygons are the same size.

In a further preferred embodiment n, the number of sides of the polygon may be six or more, and more preferably eight or greater.

One of ordinary skill in the art will, however, appreciate that there may be implementations in which the size of the polygons may vary with position so the line thickness, i.e., the local cross-sectional area, of the 3D printed object, may be different at different locations within the 3D printed object. Furthermore, the polygons may not be regular. There may be applications in which other cross-sections such as, but not limited to, a rectangular cross-section, or a semi-circular cross-section may be desirable. Applications in which the final printed object is to be attached to a flat surface may, for instance, benefit from having a flat base though the cross-section may still be a non-rectangular cross-section such as, but not limited to, a hemispherical cross-section, a triangular cross section or any other polygon not having four sides.

In a preferred embodiment, the polygons may be formed by first generating a circle and then dividing the circle into equal arc segments to obtain the endpoints. In a preferred embodiment, the number of arc segments is preferably 6 or more, and more preferable, at least 8.

FIG. 4 also show how the vertices of the polygons may be joined to form a triangulated mesh. At a given polygon vertex 165 on an-sided polygon 160, a vertex connecting line 170 may be calculated to join that vertex to a corresponding vertex 175 on a next, adjacent polygon. A second vertex connecting lines 170 may also be calculated that joins the polygon vertex 165 to an adjacent vertex 180 on the next polygon, thereby forming a triangle. Repeating this process for each vertex on each polygon may lead to a surface enclosing the vector graphic, with the surface represented as a triangulated mesh.

In FIG. 4, the n-sided polygon 160 is shown centered on the endpoints 140. One of ordinary skill in the art will, however, appreciate that the polygon may have other ways of being associated with the endpoints 140 such as, but not limited to, having one of the vertices located at the endpoints 140, or a midpoint of a side of a polygon located at an endpoint or some combination thereof.

Figure 5:
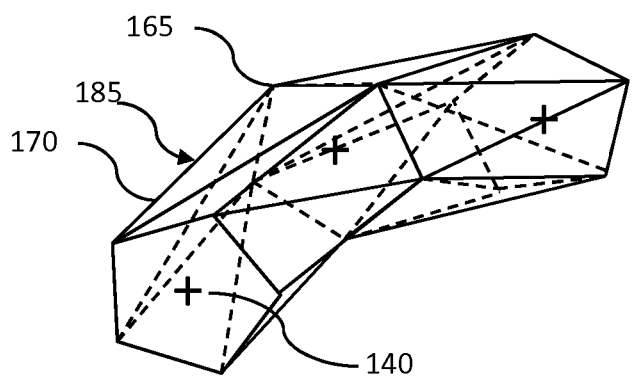
FIG. 5 shows a schematic representation of a vector graphic converted into a 3D mesh.

FIG. 5 shows a schematic representation of a vector graphic converted into a triangular mesh 185. The triangulated structure may have a number of vertex connecting lines 170 connecting the polygon vertices 165 in the manner described above. The endpoints 140 may now be fully enclosed by the triangulated surface.

Figure 6:
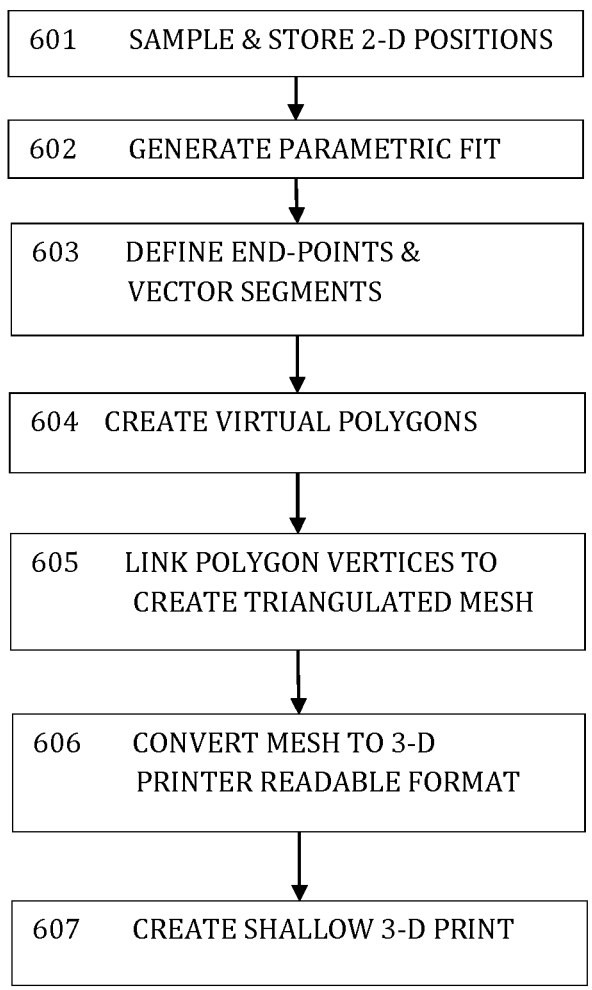
FIG. 6 shows a schematic flow chart of steps in a method for producing a 3D print from a vector graphic.

FIG. 6 shows a schematic flow chart of steps in a method for producing a 3D representation of a vector graphic.

Step 601: Sample & Store 2D positions. This step may be a part of providing a 2D vector graphic.

A user may, for instance, use a location detecting device to trace or otherwise draw or define a 2D pattern or object. The location detecting device may be a device such as, but not limited to, a computer mouse, a stylus, a track ball, a touch screen, a GPS receiver, a motion sensing device, a 3D sensing device, one or more accelerometers or gyroscopes or any other device capable of generating or registering 2D positional information, with or without user interaction. The device is preferably capable of supplying repeated 2D positional information as a function of over time, and more preferably at predetermined, constant time intervals. A computer mouse or stylus may, for instance, operate using optical components, pressure sensitive components or motion sensitive components, or a combination thereof.

Having obtained and stored a number of x,y coordinate pairs, these may themselves be used as end points, and the straight lines joining them may be used as vector segments that together may constitute the vector graphic.

In a preferred embodiment, a software module may first go to Step 602 and automatically generate a parametric curve, or sequence of parametric curves, that connect the obtained and stored x,y coordinates. The automatically generated parametric curves may, for instance, be curves such as, but not limited to, B-spline curves, Bezier curves, a non-uniform rational basis spline (NURBS) or some combination thereof.

The software module may then resample the parametric curve in order to obtain a set of endpoints and use them to generate vector segments as straight lines joining the endpoints in Step 603.

The software module may further allow a user to interact with the parameterized, fitted curve. The software may for instance display the curve on a video screen and allow a user to adjust the shape of the curve using, for instance, the control points on the Bezier curve or the amalgamation of Bezier curves. The module may also enable the user to perform pre-defined transforms, either on the original x,y sample points or the parameterized representation of the sample points, or the user adjusted curve derived from the sample points.

The software module may further automatically generate line drawings and/or full 3D shapes that may be supplementary or complementary to and therefore combined with user defined drawings or used on their own. These computer/digitally generated lines and/or shapes may be obtained via pre-programmed algorithms and scripts, and may alter or grow to realize a specific end-shape or a particular end goal including but not limited to, arrive at a given object, based on a story or other contextual information. This may be accomplish by methods such as, but not limited to, using pre-programmed, deterministic instructions, using randomized values of generative parameters to augment pre-programed instructions, or in a manner dependent upon one or more values supplied via user interaction at a given point in time during the operation of the program, or some combination thereof. The user interaction may be via means such as, but not limited to, gesture, touch, voice, biofeeback or biosensing methods that may involve measuring user controllable functions such as, but not limited to, heart rate, blood pressure, brainwaves, muscle tone, skin conductance, heart rate and pain perception, or some combination thereof. For instance, growth of complementary line drawing may not be generated until a user's heart rate drops below a certain value, or different supplementary line drawings may be generated dependent on the value of the measured heart rate.

The automatically generated additional line drawings may, for instance, be added using augmentation module that may be operable on the digital device. This augmentation module may, for instance, augment the original vector graphic, that may be a user created line drawing, with an automatically generated additional vector graphic. The augmentation module may be configured such that the additional vector graphic varies dependent on further user input. That further user input may, for instance, be information such as, but not limited to, gesture, voice or biofeedback or biosensing information.

Once the user is satisfied with the shape of the curve, the software module may then proceed to Step 603: Define Endpoints and Vector Segments. In this step the curve, as adjusted by the user, may be resampled, and the resampled x,y coordinates used as end-points. Those end-points may then be used to define vector segments along straight lines joining them, thereby defining a 2D vector graphic.

Step 604: Create virtual polygons. As detailed above, in a preferred embodiment of the present invention, this may be accomplished by first generating virtual circles, one centered on each of endpoints, and located in a plane that is perpendicular to the result vector of the two vector segments linked directly to that endpoint. The radius of the circle may depend on a number of factors such as, but not limited to, the print material being used, a print method being used and a scaling factor, or some combination thereof. The scaling factor may, for instance, be required to convert a curve such as, but not limited to, a sequence of dance moves captured by a GPS or other location detector, then scaled to form a 2D vector graphic representative of the dance routine but of a size that may be printed by an available 3D printer. The height of a dancer's center of gravity may, for instance, also be captured and represented by a color of material printed at that point, or by a thickness of a line, i.e., a cross sectional area of the printed object being printed at that point.

The circles may then be converted into a series of congruent, regular polygons by dividing the circumference of the circle into equal parts. In a preferred embodiment, there would be at least 6 equal parts, and in a more preferred embodiment, at least 8 equal parts, or sides of a polygon, though various embodiments may have as many as 24 or even more sides.

In a further preferred embodiment of the invention, the radius of the circle may be adjusted to reflect a further parameter of the data captured by the motion detecting and sampling device described above. The further parameter may, for instance, be a property such as, but not limited to, a pressure being applied to the device at the point captured, a velocity of the device at the point captured, a further action of the user such as, but not limited to, a mouse button being depressed, interaction with a user interface (UI) software widget or app, interaction with a UI device, a gesture being performed, a voice input or a keyboard key being held down or otherwise activated, or some combination thereof.

The number of parts the circumference is divided into may, however, be consistent so that all the polygons are similar. The polygons may be regular, i.e., have all there sides equal, or they may differ in order, for instance, to approximate a semi-circular cross section or a rectangular cross section, both of which may have benefits if the final 3D representation of a vector graphic is to be attached to, or displayed on, a flat surface.

Step 605: Link Polygon vertices to create triangulated mesh. As described above, the vertices may be joined to form a triangulated mesh by joining each vertex first to a corresponding vertex on the next adjacent polygon, and then with another line to a vertex on the next adjacent polygon that is adjacent to the corresponding vertex. Such a mesh may form a surface, but that surface may not be optimal. An optimal surface may, for instance, be one in which all the triangles of the mesh have the maximum minimum-internal-angle between joined sides. Such triangles are called Delaunay triangles and may be characterized by the circumcircle of any triangle of a mesh enclosing no more than three end-points. There are well-known algorithms for computationally efficient ways of converting any triangulated mesh into a triangulated mesh in which all triangles are Delaunay triangles. Such algorithms include, but are not limited to, divide and conquer algorithm for triangulations in two dimensions due to Lee and Schachter and improved first by Guibas and Stolfi and later by Dwyer, sweep-line algorithms by Fortune, and sweep-hull algorithms.

Other issues or aberrations associated with automatic creation of triangulated meshes include problems such as, but not limited to, self-intersecting portions of the mesh, the resultant holes in the mesh or unnecessary lines, or some combination thereof. These are typically ill-defined problems, i.e, they are problems that may have more than one legitimate solution. Never the less, there are a number of software modules designed to attempt to address such problems, with varying assumptions as to what an ideal or legitimate result would be. These programs include, but are not limited to, MeshFix™, PolyMender™, ReMesh™ and TrIMM™. One of these programs may be run to repair a mesh, or the algorithms employed by such software may be incorporated within the software module of the present invention.

Once a satisfactory mesh has been created, Step 606 of Convert Mesh to 3D Printer Readable format may be implemented. 3D Printer's typically read and print files have the structure defined in STL format. It may be possible to convert xyz files into STL format using in-house created software modules or using open source software modules and libraries or commercially available software such as but not limited to, MeshLab™, Embossify™ and AnyCAD Exchange3D™.

Having produced a file that may be read by a 3D printer, the file may then be sent to a 3D printer for printing as a 3D representation of the vector graphic In a further preferred embodiment of the invention, the software module may incorporate an image such as, but not limited to, a jpeg or tiff image, as a basis for tracing. The module may also be able to automatically perform image or pattern recognition functions such as, but not limited to, edge detection or boundary thresh-holding, using computer vision methods including but not limited to the Sobel operator, Canny edge detection, and/or segmentation methods resulting in the definition of a curve, to automatically extract a contour and provide some or all of a vector graphic, or some or all of a seed for a vector graphic.

A module may load a guide such as, but not limited to, an image, a regular grid, a parallel line or some combination thereof that can be used as a visual help or as a drawing guide for a user. The user drawing may, for instance, be displayed as an overlay on top of the guide.

If the guide is an image, the module may incorporate a computer vision method for automatically or semi-automatically detecting contours from the image. The computer vision methods may also or instead be used for sensing user inputs and interactions, using algorithms such as, but not limited to, optical flow-based motion sensing to detect user gesture).

The module may also incorporate a post-processing step to generate more complex shapes via interaction with the user and/or automated transformations.

In a further preferred embodiment of the invention, the device used to input the vector graphic, or the sample points used to obtain the end-points of the vector graphic, may be responsive to pressure applied to the device. The pressure sensed as the vector graphic, or the proto-vector graphic, or a portion thereof, is being generated may be reflected in the final flat 3D print as a change in some characteristic such as, but not limited to, the thickness, the cross-section, the color or the material printed or some combination thereof.

In a further preferred embodiment of the invention, the 3D printed object may be attached to another object such as, but not limited to, a photograph, a painting, a printed page, a wall, an item of clothing, a piece of jewelry, a craft or hardware item, or some combination thereof. The attachment may be by a means such as, but not limited to, an adhesive, stitching, riveting, melting or some combination thereof.

In a still further preferred embodiment, the invention may include data capture by a fully 3D pen. Such a pen may, for instance, capture 3D motion by means of one or more accelerometers as a tip of the pen is moved by a user in 3D space. The captured motion may, for instance, be displayed on a computer screen using software such as, but not limited to, 3D modeling software. The pen may also include function buttons, or pressure sensors that enable a used to specify color, object width, material to be printed or some combination thereof. Such a 3D pen may, for instance, be implemented as an app on a smartphone or as a custom item of hardware.

Although this invention has been described with a certain degree of particularity, it is to be understood that the present disclosure has been made only by way of illustration and that numerous changes in the details of construction and arrangement of parts may be resorted to without departing from the spirit and the scope of the invention.

What is claimed is:

1. A method for interactively producing a 3D object from a vector graphic, comprising:
   providing said vector graphic comprising a plurality of endpoints connected by vector segments to form an open curve having no thickness;
   providing a 3D printer;
   providing a digital computing device;
   providing a software module comprising computer readable and executable instructions stored on a memory functionally linked to said digital computing device that enable said digital computing device to perform the functions of:

for each of said endpoints of said vector graphic, generating a separate n-sided polygon by the addition of at least n−1 newly created endpoints joined by vector segments;

for each pair of said generated n-sided polygons, generating a plurality of vertex connecting lines thereby joining each of said polygon vertex endpoints of said polygons to a corresponding vertex endpoint of a next adjacent polygon, and to an adjacent vertex endpoint of said next adjacent polygon, thereby creating a volume containing triangular mesh corresponding in shape to said vector graphic;

converting said triangular mesh into instructions readable by a 3D printer; and printing said triangular mesh using said 3D printer, thereby creating a realized 3D object corresponding in shape to said vector graphic.

2. The method of claim 1 wherein said polygons are regular polygons and are oriented on a plane substantially orthogonal to a vector adjacent to and following said endpoint.

3. The method of claim 2 wherein said vertices are said regular polygons are formed by regularly positioned points around a virtual circle centered on said endpoint, and oriented on said plane.

4. The method of claim 1 wherein providing said vector graphic further comprises:
sampling and storing a 2D position of a user controlled device or appendage at regular time intervals; and
defining said endpoints and vector segments using said stored 2D positions.

5. The method of claim 4 further comprising:
automatically generating a smooth parametric representation of said 2D positions; and
generating a regular set of end-points by sampling said smooth parametric representation; and
defining said vector segments using said regular set of end-points.

6. The method of claim 4 wherein providing said vector graphic further comprises providing an image as a guide for a user.

7. The method of claim 6 further comprising automatically extraction a contour from said image, and using said contour as a portion of said vector graphic.

8. The method of claim 4 wherein defining said endpoints and vector segments further comprises applying a pre-defined transform to said stored 2D positions.

9. The method of claim 3 wherein a radius of said virtual circle is adjusted dependent on one of a print material, a print method and a scaling factor, or some combination thereof.

10. The method of claim 1 wherein said vector graphic is supplied via input from a user, and further comprising:
an augmentation module, operable on said digital computing device, that augments said vector graphic with an automatically generated additional vector graphic.

11. The method of claim 10 wherein said additional vector graphic varies dependent on further user interaction.

12. The method of claim 11 wherein said further user input comprises biofeeback or biosensing information from said user.

13. The method of claim 4 further comprising:
providing a pressure sensitive device;
generating a portion of said vector graphic using said pressure sensitive pen;
adjusting said radius of said virtual circle for one of said endpoints dependent on a pressure sensed by said pressure sensitive pen when sampling said corresponding 2D position.

14. The method of claim 4 further comprising:
providing a pressure sensitive device;
generating a portion of said vector graphic using said pressure sensitive pen; and
adjusting a color to be printed for the mesh dependent on a pressure sensed by said pressure sensitive pen when sampling said corresponding 2D position.

15. The method of claim 4 further comprising:
providing a pressure sensitive device;
generating a portion of said vector graphic using said pressure sensitive pen; and
adjusting a material to be printed for the mesh dependent on a pressure sensed by said pressure sensitive pen when sampling said corresponding 2D position.

16. The method of claim 1 further comprising:
repairing defects of said automatically created triangular mesh using a defect repair module.

17. The method of claim 16 wherein said defect repair module detects and corrects self-intersections and unnecessary lines.

18. The method of claim 1 further comprising:
providing a second physical object; and
attaching said realized 3D object to said second physical object.

19. A system for interactively producing a 3D printed object from a vector graphic, comprising:
a vector graphic comprising a plurality of endpoints connected by vector segments to form an open curve having no thickness;
a digital computing device;
a 3D printer;
a software module comprising computer readable instructions stored on a memory functionally connected to said digital computing device and executable by said digital computing device that enable said digital computing device to perform the functions of:
for each endpoint of said vector graphic, generating an n-sided polygon by the addition of at least n−1 newly created endpoints joined by vector segments; and
for each of pair said generated n-sided polygon, generating a plurality of lines connecting each vertex endpoint of said polygon to a corresponding vertex endpoint of a next adjacent polygon, and to an adjacent vertex endpoint of said next adjacent polygon, thereby creating a triangular mesh corresponding in shape to said vector graphic; and
converting said triangular mesh into instructions readable by a 3D printer; and
printing said triangular mesh using said 3D printer, thereby creating a 3D realized object.

* * * * *